US012721044B2

(12) United States Patent
Gaudin et al.

(10) Patent No.: US 12,721,044 B2
(45) Date of Patent: Aug. 25, 2026

(54) METHOD FOR FABRICATING AN ASYMMETRIC SOT-MRAM MEMORY CELL UNIT, AND MEMORY CELL UNIT OBTAINED BY IMPLEMENTING THIS METHOD

(71) Applicants: CENTRE NATIONAL DE LA RECHERCHE SCIENTIFIQUE, Paris (FR); UNIVERSITE PARIS-SACLAY, Gif sur Yvette (FR); COMMISSARIAT À L'ÉNERGIE ATOMIQUE ET AUX ÉNERGIES ALTERNATIVES, Paris (FR)

(72) Inventors: Gilles Gaudin, Corenc (FR); Ioan Mihai Miron, Grenoble (FR); Olivier Boulle, Grenoble (FR); Dafine Ravelosona, Villiers le Bacle (FR)

(73) Assignees: Centre National de la Recherche Scientifique, Paris (FR); Université Paris-Saclay, Gif-sur-yvette (FR); Commissariat à l'Energie Atomique et aux Énergies Alternatives, Paris (FR)

(*) Notice: Subject to any disclaimer, the term of this patent is extended or adjusted under 35 U.S.C. 154(b) by 379 days.

(21) Appl. No.: 18/560,447

(22) PCT Filed: May 17, 2022

(86) PCT No.: PCT/EP2022/063257

§ 371 (c)(1),
(2) Date: Nov. 13, 2023

(87) PCT Pub. No.: WO2022/243279

PCT Pub. Date: Nov. 24, 2022

(65) Prior Publication Data

US 2024/0260478 A1 Aug. 1, 2024

(30) Foreign Application Priority Data

May 18, 2021 (FR) ..................................... 21 05175

(51) Int. Cl.
*H10N 50/01* (2023.01)
*H10B 61/00* (2023.01)

(52) U.S. Cl.
CPC ............. *H10N 50/01* (2023.02); *H10B 61/00* (2023.02)

(58) Field of Classification Search
CPC ....... H10N 50/10; H10B 61/00; G11C 11/161
See application file for complete search history.

(56) References Cited

U.S. PATENT DOCUMENTS

2013/0084653 A1* 4/2013 Rubin .................... H10N 50/01 257/E43.006
2013/0155549 A1* 6/2013 Rubin .................... G11B 5/746 428/800

(Continued)

FOREIGN PATENT DOCUMENTS

FR 3002690 A1 8/2014
FR 3031622 A1 7/2016

(Continued)

OTHER PUBLICATIONS

International Search Report issued on Sep. 16, 2022, in corresponding International Application No. PCT/ EP2022/063257, 6 pages.

(Continued)

*Primary Examiner* — Edward Chin
(74) *Attorney, Agent, or Firm* — Maier & Maier, PLLC

(57) ABSTRACT

A method for fabricating an asymmetric SOT-MRAM memory cell unit, the memory cell unit including a conductor track and a pad, arranged on the conductor track and including at least one first magnetic region with free magnetization. The method further includes producing a stack of (Continued)

a plurality of extended layers, including at least one first extended magnetic layer; depositing a mask on an upper surface of the stack; and defining the first magnetic region in the first extended magnetic layer though ion irradiation of the upper surface of the stack carrying the mask, the parameters of the ion irradiation being adapted so as to modify magnetic properties of the material forming the first magnetic layer.

15 Claims, 9 Drawing Sheets

(56) References Cited

U.S. PATENT DOCUMENTS

2013/0285177 A1 10/2013 Kontos et al.
2014/0038311 A1* 2/2014 Kim .................... G11C 11/161 438/3
2016/0293835 A1 10/2016 Guo
2017/0062709 A1* 3/2017 Kim .................... H10N 50/85
2020/0212103 A1 7/2020 Yang et al.
2022/0238601 A1* 7/2022 Pinarbasi .............. H10N 50/01

FOREIGN PATENT DOCUMENTS

JP 2004165441 A 6/2004
JP 2014241428 A * 12/2014
JP 2016513374 A 5/2016

OTHER PUBLICATIONS

French Search Report issued on Dec. 7, 2021, in corresponding Application No. 21 05175, 2 pages.

Office Action issued on Feb. 3, 2026, in corresponding Japanese Application No. 2023-569934, 3 pages.

* cited by examiner

METHOD FOR FABRICATING AN ASYMMETRIC SOT-MRAM MEMORY CELL UNIT, AND MEMORY CELL UNIT OBTAINED BY IMPLEMENTING THIS METHOD

FIELD

The general field of the invention is that of non-volatile memories of the asymmetric SOT-MRAM type. More particularly, the invention relates to methods for fabricating an SOT-MRAM memory point.

BACKGROUND

An MRAM ("Magnetic Random Access Memory") includes memory point a pad consisting of a stack of a plurality of regions of small thickness. This plurality of regions includes at least one first magnetic region having free magnetisation, a second magnetic region having fixed magnetisation and a region forming a tunnel barrier at the interface between the first and second magnetic regions.

The direction of magnetisation in the first and second magnetic regions can be either parallel to the plane of the regions or perpendicular to the plane of the regions. Herein, the case of a perpendicular direction of magnetisation will be more particularly described, but this teaching extends directly to the case of a parallel direction of magnetisation.

The direction of magnetisation in the first magnetic region enables binary information to be stored.

For an STT-MRAM (Spin Transfer Torque MRAM) memory point, writing binary information is performed by injecting a write current through the pad (that is, perpendicularly to the plane of the regions), then reading the stored information is performed by injecting a read current, also through the pad.

This technology has a number of disadvantages, especially the reduced write speed related to rapid ageing of the memory for high write current densities, and the risk of errors between read and write steps within an array of STT-MRAM memory points.

SOT-MRAM (Spin Orbit Torque MRAM) memory points have therefore been provided, for which the pad is disposed in the centre of a conductive track, the two ends of which are fitted with electrodes.

Writing is then performed by injecting a write current between the two electrodes, through the conductive track, that is, in parallel to the plane of the pad regions, while reading is performed, as for an STT-MRAM memory point, by injecting a read current perpendicularly to the plane of the regions, through the pad.

However, to operate effectively, an SOT-MRAM memory point should be placed in an outer magnetic bias field having a component colinear with the direction of injection of the write current. Yet, the means for generating such a magnetic field is the cause of major difficulties in integrating SOT-MRAM memories.

This is why, more recently, asymmetric SOT-MRAM memory points have been provided. For example, document FR 3 031 622 describes different embodiments of an asymmetric SOT-MRAM memory point.

In the aforementioned document, the asymmetry results from shaping the pad so that it is no longer symmetric with respect to a reference plane, which is both perpendicular to the plane of the pad regions and parallel to the direction of injection of the write current into the conductive track.

This geometric asymmetry makes it possible to create a break in the mirror symmetry with respect to the reference plane, having substantially the same effects as the application of an outer magnetic bias field. With asymmetric SOT-MRAM memory points, it is then no longer necessary to use an outer magnetic field.

Advantageously, the pad further has tips enabling the swing of magnetisation in the first magnetic region to begin depending on the direction of injection of the current into the conductive track. These tips are very small, which makes industrial production of the pads even more difficult.

Now that asymmetric SOT-MRAM memory points have proved their worth, the problem arises of fabricating these non-volatile memory devices on an industrial scale.

Indeed, in the laboratory, the methods implemented for fabricating samples at sizes compatible with industrial use, typically below 100 nm, typically use electron lithography.

Although they enable asymmetric SOT-MRAM memory pads to be defined with the required precision, these methods are characterised by reduced fabrication speeds. This is especially due to the need to move the electron beam to perform insolation of the resin that is used to define the shape of each memory point. Such methods are therefore not compatible with industrial production, where it is attempted, for example, to structure several billion memory points on a semiconductor wafer with a radius of 300 mm as quickly as possible.

SUMMARY

One object of the invention is therefore to solve this problem, especially by providing a method for fabricating SOT-MRAM memory points at the throughputs required by industry.

For this, one object of the invention is a method for fabricating an asymmetric SOT-MRAM memory point, the memory point including a conductive track and a pad, disposed on the conductive track and including at least one first magnetic region with free magnetisation, the method being characterised in that it includes the steps consisting in: making a stack of a plurality of extended layers, including at least one first extended magnetic layer; depositing a mask onto an upper surface of the stack; and delimiting the first magnetic region in the first extended magnetic layer by ion irradiation of the upper surface of the stack carrying the mask, the parameters of ion irradiation being adapted to modify magnetic properties of the constituent material of the first magnetic layer.

According to particular embodiments, the method includes one or more of the following characteristics, taken separately or according to any technically possible combination:

- ion irradiation allowing for modifying the magnetic properties of a zone of the first magnetic layer exposed during ion irradiation, while retaining the magnetic properties of a zone of the first magnetic layer not exposed during ion irradiation because of the presence of the mask.
- the ion irradiation delimitation step includes, during an irradiation duration, relative displacement of an ion source with respect to the upper surface of the stack carrying the mask so as to modify a direction of irradiation, the irradiation parameters being adapted to be sufficient to remove the magnetic properties of a zone exposed during the whole irradiation duration, but insufficient to remove the magnetic properties of a zone exposed only during a fraction of the irradiation duration.

the ion irradiation delimitation step includes a first irradiation along a first direction of irradiation, followed by a second irradiation along a second direction of irradiation, the parameters of the first irradiation and the second irradiation being chosen so as to be sufficient to remove the magnetic properties of a zone exposed during both the first irradiation and the second irradiation, but to be insufficient to remove the magnetic properties of a zone exposed only during the first irradiation or only during the second irradiation.

Between the first and second ion irradiations, the method includes a step of modifying the mask.

ion irradiation implements light ions, preferably He+, of low energy, preferably between 10 and 100 keV, even more preferably equal to 30 keV, and with an intensity between $10^{14}$ and $10^{17}$ ions/cm$^2$, preferably equal to $10^{16}$ ions/cm$^2$.

the method includes, after the step of depositing a mask and before the ion irradiation delimitation step, an etching step consisting in etching the upper layers of the stack around the mask deposited so that the ion flow used during ion irradiation can reach the first magnetic layer.

making a stack of a plurality of extended layers consists in superimposing, on a semiconductor substrate, a conductive layer, a first magnetic layer, an intermediate layer, a second magnetic layer and an electrode layer.

the method including, after the ion irradiation delimitation step, a step of finishing the memory point consisting in removing the mask, etching the stack to expose a conductive track on either side of the pad, and making electrodes at each of the ends of the conductive layer, as well as on the pad.

One object of the invention is also an asymmetric SOT-MRAM memory point obtained by implementing the above method.

BRIEF DESCRIPTION OF THE FIGURES

The invention and its advantages will be better understood upon reading the following detailed description of a particular embodiment, given solely by way of non-limiting example, this description being made by referring to the appended drawings in which.

DETAILED DESCRIPTION

1. Memory Device to be Fabricated

Figure 1:
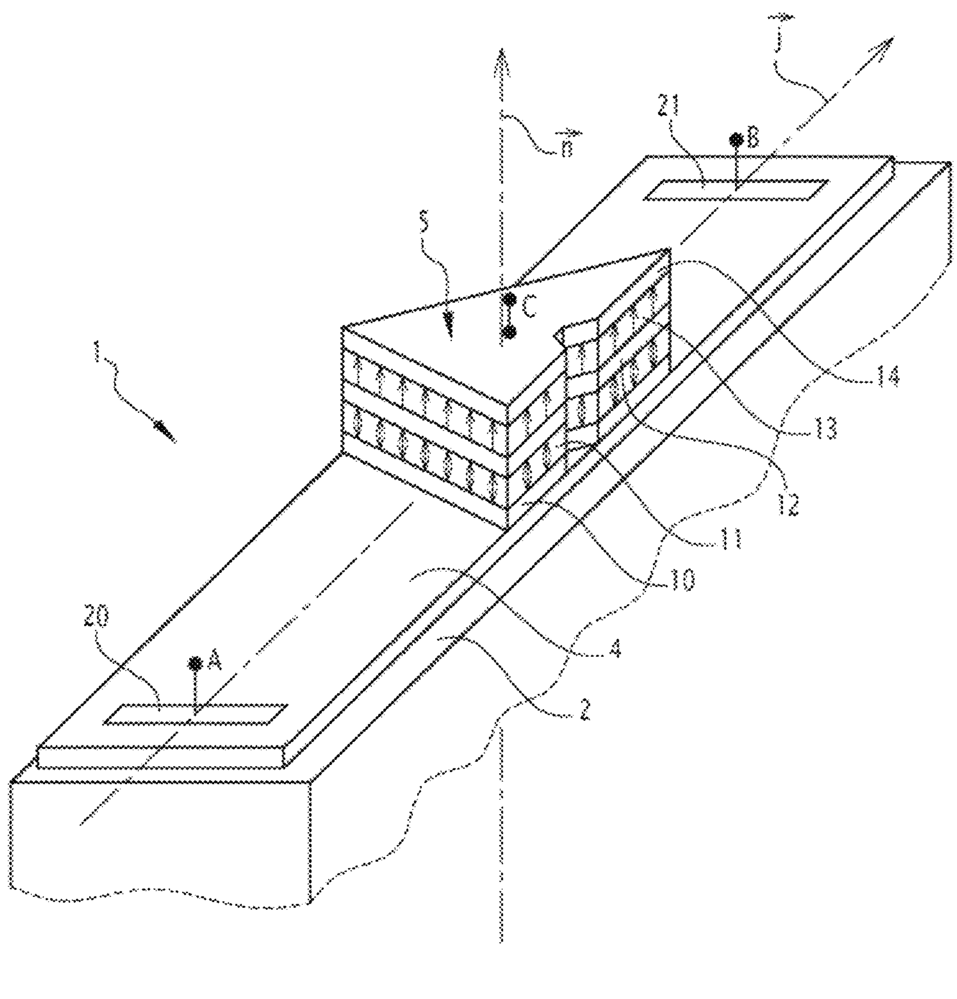
FIG. 1 is a theoretical representation of a memory point of the asymmetric SOT-MRAM with perpendicular magnetisation type.

One example of the memory point which is intended to be fabricated is represented in FIG. 1. It is a memory point of the asymmetric SOT-MRAM with perpendicular magnetisation type.

This memory point 1 comprises a pad 5 above a conductive track 4. The conductive track 4 is preferably formed on a substrate 2.

For example, the substrate 2 consists of a silicon wafer coated with silicon oxide.

The conductive track 4 is made of an electric current conductive material, for example a metal, such as copper Cu. The materials usable for the region 10, indicated below, can also be used for the track 4. Advantageously, the same material is used for both the track 4 and the layer 10. Alternatively, the layer 10 is only a thicker part of the track 4.

The conductive track 4 is rectilinear along a direction j. In the vicinity of its ends, the conductive track 4 carries electrodes 20 and 21, constituting terminals A and B respectively.

The pad 5 is disposed substantially in the middle of the conductive track 4.

The pad 5 comprises a superimposition of regions of small thickness. The regions are stacked along a perpendicular direction n, which is orthogonal to the plane of the conductive track 4.

A region may be formed of a single material or of a stack of several strata of different materials.

The pad 5 thus comprises in succession, starting from the conductive track 4 and along the perpendicular direction n, a conductive contact region 10, a first magnetic region 11, an intermediate region 12, a second magnetic region 13 and an electrode region 14.

The conductive contact region 10 is made of an electric current conductive material. It may, for example, be a non-magnetic metal, such as Pt, W, Ir, Ru, Pd, Cu, Au, Bi or Hf, or an alloy of some of these metals, or a stack of several strata of some of these metals or alloys of these metals. It may also be a magnetic material, typically an antiferromagnetic material such as PtMn, IrMn or FeMn, The conductive contact region 10 has a thickness of between 0.5 nm and 200 nm, preferably between 0.5 nm and 100 nm, even more preferably between 0.5 nm and 3 nm.

The conductive contact region 10 can be omitted, provided that the conductive track 4 is made of a material suitable for growth of the constituent material of the first magnetic region 11 and is capable of generating a spin-orbit torque (SOT) mechanism. The track 4 is then typically comprised of the materials listed above for the conductive contact region 10.

The first and second magnetic regions 11 and 13 are made of a magnetic material, or a magnetic material compound, or several strata of magnetic and non-magnetic materials. For example, it may be an alloy having its own perpendicular magnetic anisotropy, such as FePt, FePd or CoPt, or a rare earth/transition metal alloy, such as GdCo or TbFeCo. It may also be or a metal or alloy having perpendicular magnetic anisotropy induced by interfaces with neighbouring regions, especially Co, Fe, CoFe, CoFeB, FeB, Ni, Py, CoNi.

The first magnetic region 11 has a thickness of between 0.7 and 3 nm, and more precisely between 0.8 and 1.4 nm.

The second magnetic region 13 has a thickness generally greater than that of the first region 11. Indeed, it is often made by superimposing several strata.

The intermediate region 12 is made of a non-magnetic material. The material of the region 12 may be conductive, but it is preferably insulating. For example, it may be a dielectric oxide such as MgO, SiO, AlO, TiO, TaO, HfO, or a dielectric nitride, such as SiN, BN.

It should be noted that the chemical formulae of the materials mentioned herein are generic in the sense that they do not specify the stoichiometry between their components, especially as this stoichiometry may not be achieved in the crystal forming the material considered.

For example, the intermediate region 12 has a thickness of between 0.5 nm and 200 nm, preferably between 0.5 nm and 100 nm, and even more preferably between 0.5 nm and 3 nm.

In any case, the intermediate region 12, if it consists of an insulating material, is sufficiently thin for electrons to pass therethrough by tunnel effect.

The electrode region 14 is made of an electric current conductive material. The region 14 constitutes an electric terminal C.

In the case of a memory point with magnetisation perpendicular to the planes of the pad regions, there is preferably a structural difference between the non-magnetic regions 10 and 12 so as to create an asymmetric system in the perpendicular direction n. This difference may especially result from a difference in material, thickness or growth mode of the materials of these two regions.

Still in the case of a memory point with perpendicular magnetisation, the magnetic materials of the first and second magnetic regions 11 and 13 are formed under conditions such that they have a magnetisation directed along the perpendicular direction n.

The magnetic material of the second magnetic region 13 is formed under conditions such that it retains a permanent direction of magnetisation (trapped magnetisation). For example, the magnetisation of the second magnetic region 13 is in the same direction as the perpendicular direction n.

On the other hand, the magnetic material of the first magnetic region 11 is formed under conditions such that the direction of its magnetisation can be modified (free magnetisation). The magnetisation of the first magnetic region 11 is thus either in the same direction as the perpendicular direction n ("up" orientation), or in a direction opposite to the perpendicular direction n ("down" orientation).

A current generator, not represented in FIG. 1, enables circulation of a write current between terminals A and B, through the conductive track 4. The write current circulates substantially along the direction j, in either direction, in the plane of the conductive track 4.

"Programming" the memory point 1, that is, the swing of the orientation of the magnetisation of the first magnetic region 11 in one direction or the other, is performed by circulating a write current along the direction j, that is, in parallel to the plane of the constituent regions of the pad 5.

Depending on the direction of circulation of the write current in the conductive track 4 (either in the direction j between the terminals A and B, or in the direction opposite to the direction j between the terminals B and A), the first magnetic region 11 is programmed by selecting the direction of its magnetisation "up" or "down".

For reading the state of the memory point 1, a read voltage is applied (by a read circuit, not represented in FIG. 1) between the terminal C and either terminal A or B. Measurement of the resistance of the pad 5 is indicative of the relative orientation of magnetisation between the first and second magnetic regions 11 and 13.

In order for this behaviour to be effective even without an outer magnetic bias field, a geometric asymmetry is introduced by the pad 5 with respect to a reference plane, which is defined by the directions j and n.

Thus, in the embodiment illustrated in FIG. 1, the pad 5 is shaped so that, in a top view, it has a "V" shape. It is positioned on the conductive track 4 so that the reference plane does not coincide with a plane of symmetry of the pad 5 (such as, for example, a plane along a bisector of the tip portion of the "V" formed by the pad 5, from which the two lateral arms of the "V" formed by the pad 5 originate).

2. General Information on the Fabrication Method According to the Invention

Generally speaking, the fabrication method according to the invention implements an ion irradiation technique.

Ion irradiation is a technique known and used in the state of the art either to etch a material or to modify structure of a material by implanting atoms.

However, it has recently been identified that, under some conditions (nature of the ion used, intensity of the ion beam, exposure time, etc.), the properties of a magnetic material can be altered by ion irradiation. By irradiating a magnetic material with an ion flow, it is especially possible to decrease the amplitude of magnetisation of this magnetic material, until it is possibly completely eliminated.

The method according to the invention uses this property to delimit, in an extended magnetic layer, made of a magnetic material, a magnetic region whose shape corresponds to that of the first magnetic region of the pad to be fabricated.

For this, a masking pillar is disposed above the extended magnetic layer in such a way that, while the ion irradiation is performed at a non-zero angle of incidence, the shadow cast by the masking pillar onto the extended magnetic layer prevents the modification of the magnetic properties inside the shaded zone. On the other hand, outside the shaded zone, the magnetic properties of the magnetic material are altered or even completely eliminated.

Advantageously, by performing the irradiation step for different directions of incidence (that is, different planes of incidence and/or different angles of incidence), it is possible to move the shadow cast by the masking pillar to precisely outline, in the extended magnetic layer, the contour of the first magnetic region of the pad to be made.

3. Detailed Description of One Embodiment of the Method According to the Invention for Fabricating the Memory Point of FIG. 1

Figure 2:
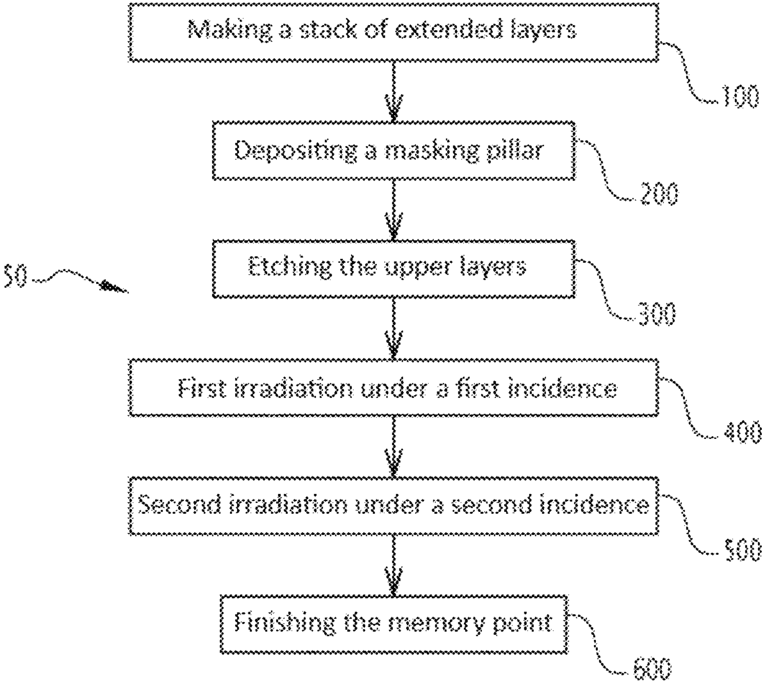
FIG. 2 is a representation, as blocks, of one embodiment of the fabricating method according to the invention, making it possible to obtain a memory point of the type represented in FIG. 1.

More precisely, turning to FIG. 2, the method for fabricating 50 includes the following steps.

In step 100, a stack is made by superimposing a plurality of extended layers. The nature of these extended layers and the order in which they are superimposed correspond to the memory point to be fabricated, in this case, in the present embodiment, the memory point 1 of FIG. 1.

Figure 3:
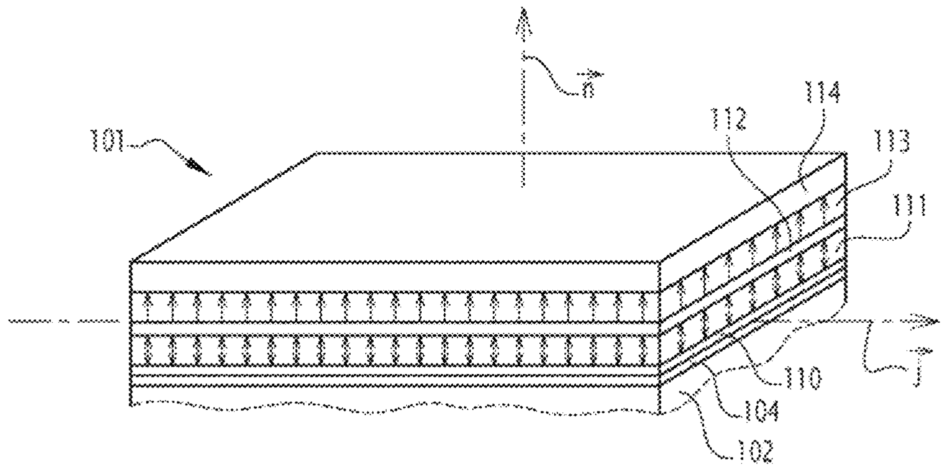
FIG. 3 represents components obtained at the end of one or more steps in the method of FIG. 2, FIG. 9 representing in particular the memory pad obtained by implementing the method of FIG. 2.

As represented in FIG. 3, at the end of step 100, the component 101 obtained includes a substrate 102, a conductive track 104, a conductive contact layer 110, a first magnetic layer 111, an intermediate layer 112, a second magnetic layer 113 and an electrode layer 114.

In a step 200, a primary masking pillar is deposited onto the stack of extended layers.

It is made, for example, of a metallic material such as Ta, W, Ti or Pt, or of a resin, which can be structured by UV (ultraviolet) light or electron beam. The latter possibility is preferable for industrial applications.

It has a shape that can be easily made using known structuring techniques, for example a cylinder with a circular base. The primary masking pillar has a height H0 and a diameter DO.

Making the primary masking pillar is performed, for example, by depositing a layer of a photoresist. The pillar is then shaped in this thick layer by UV lithography, possibly followed by ion etching to refine the lateral shape of the pillar. As the material is consumed during the shaping step, the thickness of the initial layer is chosen so as to obtain, at the end of shaping, the required height H0 for the primary masking pillar.

Figure 4:
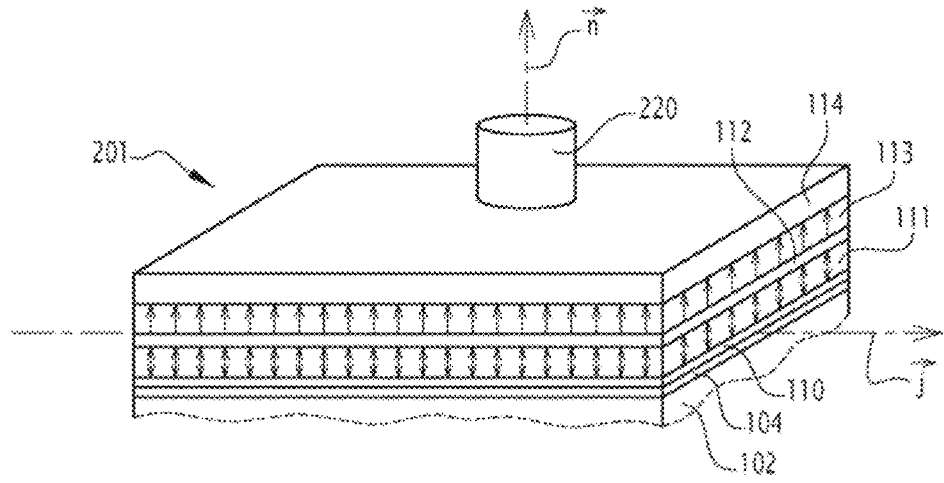
FIG. 4 represents components obtained at the end one or more the steps in the method of FIG. 2, FIG. 9 representing in particular the memory pad obtained by implementing the method of FIG. 2.

As represented in FIG. 4, the component 201 obtained at the end of step 200 has a primary masking pillar 220 above the stack of extended layers. It is located in vertical alignment with what should be the tip portion of the "V" shape of the pad 5 to be fabricated.

Advantageously, in a step 300, the stack carrying the primary masking pillar is etched, by implementing a conventional technique, so as to eliminate the upper extended layers of the stack, around the primary masking pillar, until, for example, the upper surface of the first magnetic layer 111 is exposed.

It should be noted that this etching step can be carried out as a continuation of the step of shaping the primary masking pad.

Figure 5:
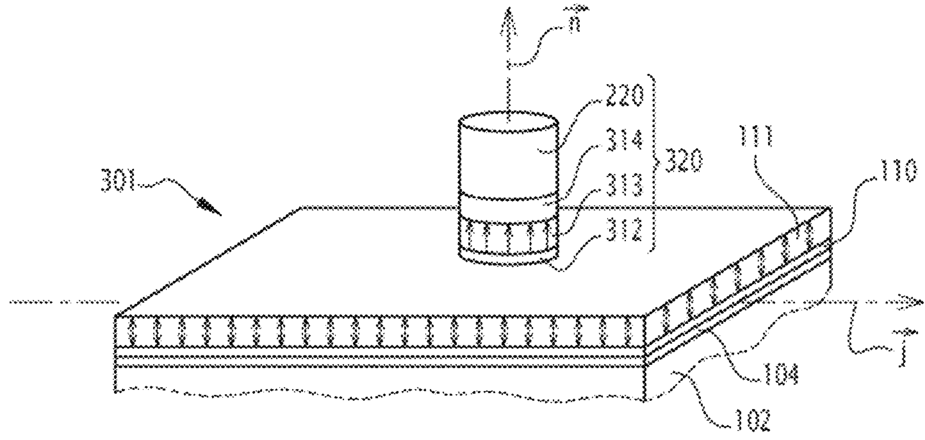
FIG. 5 represents components obtained at the end of one or more steps in the method of FIG. 2, FIG. 9 representing in particular the memory pad obtained by implementing the method of FIG. 2.

In FIG. 5, the component 301 obtained at the end of step 300 is represented. If the lower layers of the stack are not modified by etching, the upper layers of the stack are now limited to the corresponding regions of the pad 5 to be made. The component 301 thus has an intermediate region 312, a second magnetic region 313 and an electrode region 314. These upper regions and the primary masking pillar 220 which is on top of them together form a masking pillar 320.

The masking pillar typically has a height H between 10 and 150 nm, preferably 50 nm, and a diameter D between 5 and 100 nm, preferably between 10 and 30 nm.

The height H0 and diameter D0 of the primary masking pillar are therefore chosen depending on the desired heights H and D and the thicknesses of the upper layers.

Next, a first ion irradiation step 400 is carried out.

Figure 6:
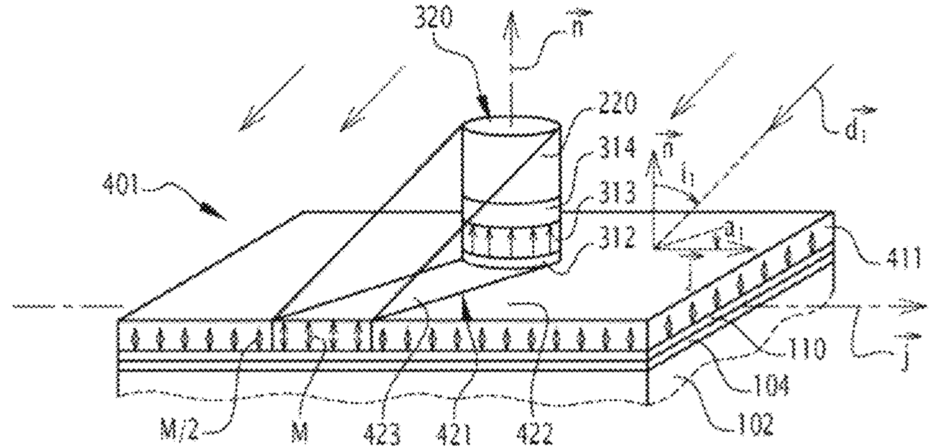
FIG. 6 represents components obtained at the end of one or more steps in the method of FIG. 2, FIG. 9 representing in particular the memory pad obtained by implementing the method of FIG. 2.
Figure 7:
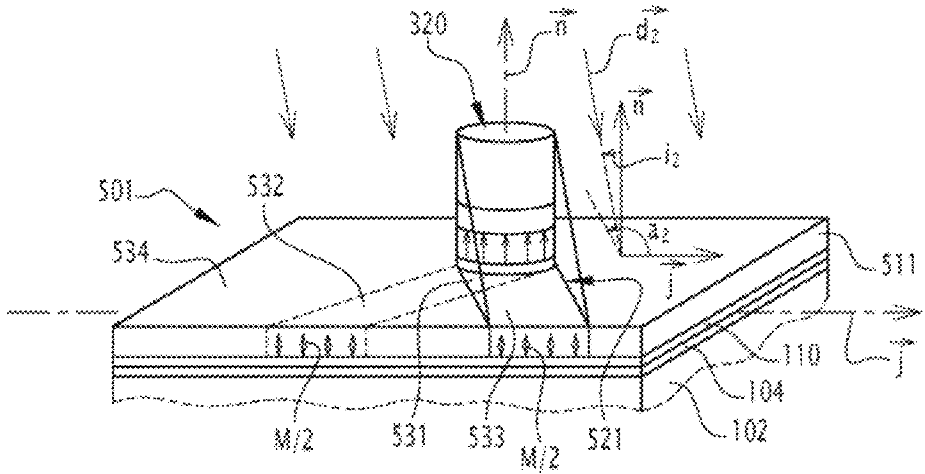
FIG. 7 represents components obtained at the end of one or more steps in the method of FIG. 2, FIG. 9 representing in particular the memory pad obtained by implementing the method of FIG. 2.

The ion flow is directed along a first direction of incidence d1 (FIG. 6). A first plane of incidence is defined by the first direction of incidence d1 and the perpendicular direction n. In the plane of the conductive track, the first plane of incidence forms a first angle a1 with the direction j. In the first plane of incidence, the ion flow forms a first angle of incidence i1 with the perpendicular direction n.

During this step, the masking pillar 320 casts a first shadow 421 onto the first extended magnetic layer 411.

The height H of the masking pillar 320 and the first direction of incidence d1 are chosen so that this first shadow 421 coincides with the contour of the first arm of the "V" shape desired for the pad.

The part of the first extended magnetic layer 411, located inside this first shadow 421, which is therefore not exposed to the ion flow, retains its magnetic properties.

On the other hand, the part of the magnetic layer 411, located outside this projected shadow, and which is therefore exposed to the ion flow, gradually loses its magnetic properties. The parameters of the first ion irradiation are chosen so that, at the end of step 400, the magnetisation amplitude is at least halved.

This is represented in FIG. 6, where the component 401 obtained at the end of step 400 includes a first magnetic layer 411, which, in a zone 423, has a maximum magnetisation amplitude M, and, in a zone 422, a magnetisation amplitude M/2.

Then, a second ion irradiation step 500 is carried out.

The ion flow is directed along a second direction of incidence d2. A second plane of incidence is defined by the second direction of incidence d2 and the perpendicular direction n. In the plane of the conductive track, the plane of incidence forms a second angle a2 with the direction j. In this second plane of incidence, the ion flow forms a second angle of incidence i2 with the perpendicular direction n.

During this step, the masking pillar 320 casts a second shadow 521 onto the first extended magnetic layer.

For example, so that, during irradiation, the second shadow cast by the masking pillar 320 delimits the contour of the second arm of the "V" shape desired for the pad, the second angle a2 is equal to 180°−a1, and the second angle of incidence i2 is equal to i1.

The part of the first extended magnetic layer 411 located inside this second shadow, which is therefore not exposed to the ion flow, retains the magnetic properties it had after the first irradiation (step 400).

On the other hand, the part of the extended magnetic layer 411 located outside this second shadow, which is therefore exposed to the ion flow, gradually loses its magnetic properties.

For example, the parameters of the second ion irradiation are chosen to be equal to those of the first irradiation, in order to divide a magnetisation amplitude M by 2.

The component 501 obtained at the end of step 500 then has a first magnetic layer 511 including:

A zone 531 at the intersection of the first and second shadows 421 and 521 (and which extends under the masking pillar 320), which has a magnetisation amplitude M, the magnetic material not having been exposed.

A zone 532 complementary to the zone 531 inside the first shadow 421, which has a magnetisation amplitude M/2, the magnetic material having been exposed during the second ion irradiation 500;

A zone 533 complementary to the zone 531 inside the second shadow 521, which has a magnetisation amplitude M/2, the magnetic material having been exposed during the first ion irradiation 400; and, A zone 534 outside the first shadow 421 and outside the second shadow 521, which has a zero magnetisation amplitude, the magnetic material having been exposed during both the first ion irradiation 400 and the second ion irradiation 500.

In this way, the shape of the first magnetic region of the pad has been "modelled" in the first extended magnetic layer 511.

In a final finishing step 600, the primary masking pillar 220 is removed to expose the electrode region 14 and form the terminal C. This operation is necessary when the primary masking pillar is made of resin. On the other hand, the primary masking pillar can be retained when it is made of an electric current conductive material and can therefore allow circulation of the reading current.

The first extended magnetic layer 511 is etched so as to expose the conductive track 4. Although this etching step is precise in depth, it does not need to be precise laterally, as the magnetically active region of the pad has been precisely delimited by irradiation. Electrodes 20 and 21 are disposed at the end of the conductive track 4 to form the terminals A and B.

Figure 8:
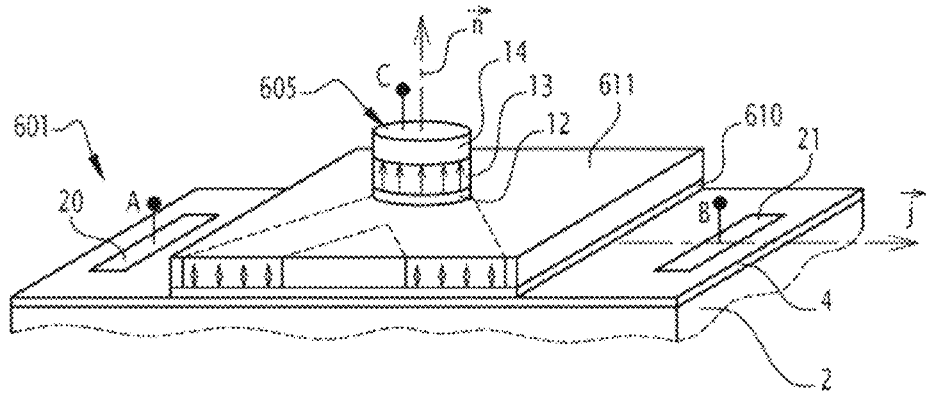
FIG. 8 represents components obtained at the end one or more steps in the method of FIG. 2, FIG. 9 representing in particular the memory pad obtained by implementing the method of FIG. 2; and, FIG. 9 illustrates an industrial implementation of the method of FIG. 2 for simultaneously fabricating a large number of memory points on a semiconductor wafer.

Thus, as represented in FIG. 8, the shape of the memory point 601 obtained by implementing the method 50 does not correspond exactly to that of the memory point 5. While the pad 605 does include a conductive track 4 on a substrate 2 and upper layers 12, 13 and 14 like the pad 5, it has a conductive contact layer 610 and a first magnetic layer 611 which may have a different shape, more extended, for example rectangular, than that of the layers 10 and 11 of the pad 5. In this first magnetic layer 611, the magnetically active region, that is, the first magnetic region of the pad 605, is precisely delimited with the desired geometric asymmetry. The memory point 601 is indeed of the asymmetric SOT-MRAM type and, in this case, with perpendicular magnetisation.

The fact that the first and second magnetic regions of the pad do not have the same geometry is not a problem since, upon reading, it is the relative orientation of magnetisation on either side of the tunnel junction made by the intermediate region 12 that is determined by measuring the electrical resistance of the pad 605.

Alternatively, it should be noted that the shape of the upper layers corresponds to the footprint of the primary masking pillar. If the latter has a geometry other than cylindrical, the geometry of the upper layers will reflect this.

Finally, in view of the penetration length R of the ions, a part of the material of the first magnetic layer, which is located under the lateral face of the pad exposed to the ions, is irradiated, modifying the magnetism at this location. The lower the angle of incidence, the greater the extension of this part. A compromise on the irradiation parameters therefore needs to be found, in view of the extension of the cast shadow desired to define the first magnetic region. One solution is especially to decrease the energy of the ion beam to decrease the penetration length R.

The person skilled in the art will therefore notice that the external shape of the memory point resulting from the implementation of the method according to the invention differs from that of the theoretical memory pad, especially in the lower layers of the pad, which include at least the first asymmetric magnetic region (free magnetisation), whereas the external shape of these lower layers is arbitrary (for example symmetric). The memory point therefore reflects the way in which it was made, that is, the different steps of the method according to the invention. In other words, the memory point obtained by implementing the present method is specific to this method.

4. Industrial Production

Figure 9:
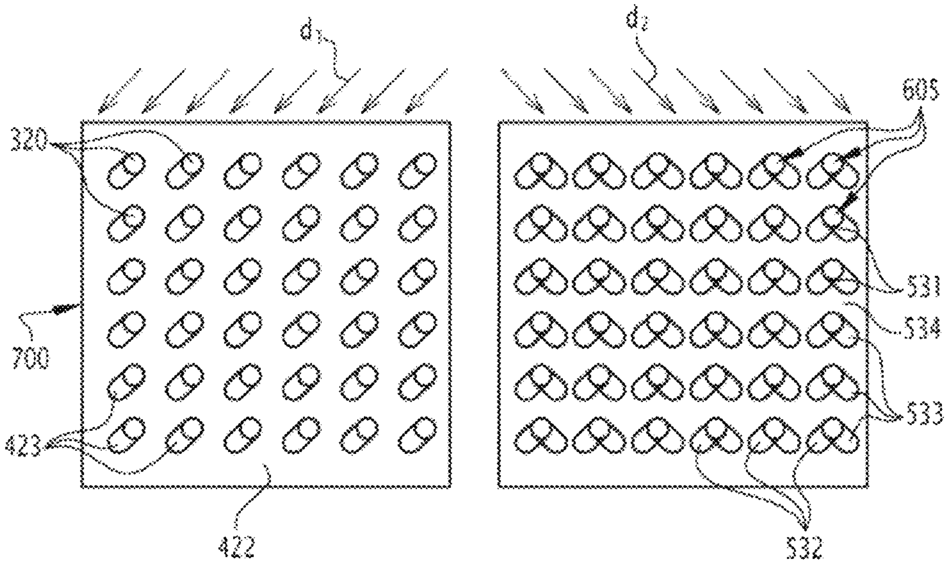

As represented schematically in FIG. 9, the method set forth above enables a large number of memory points to be produced simultaneously on a substrate wafer 700.

As illustrated in FIG. 9, after growth of the different extended layers, primary masking pillars are deposited according to a matrix pattern.

The first irradiation (left-hand side of FIG. 9), along a first direction d1, makes it possible to model a first arm of the "V" shape desired for all the pads.

The second irradiation (right-hand side of FIG. 9), along a second direction d2, makes it possible to model the second arm of the "V" shape desired for all the pads.

At the end of the implementation of the steps of the method, a substrate wafer 700 is obtained carrying a set of pads 605, which are disposed according to the initial pattern of the primary masking pillars.

Thus, in a single iteration of the steps in FIG. 2, a large number of memory points are fabricated simultaneously.

The person skilled in the art will therefore understand that the present method makes it possible to industrialise fabrication of asymmetric SOT-MRAM memory points.

5. Parameters of Ion Irradiation

Preferably, ion irradiation is irradiation of light ions, preferably He+.

These ions have a low energy, between 10 and 100 keV, for example 30 keV.

The intensity of the ion flow is characterised by its fluence. This is between $10^{14}$ and $10^{17}$ ions/cm$^2$, preferably $10^{16}$ ions/cm$^2$.

With such properties, the ion beam only induces atomic displacements of a few angstroms around the equilibrium position of the atoms, without any cascade collisions and without any physical etching or implantation of atoms. This makes it possible to modulate the overall magnetisation of the magnetic material until it is removed. A low-energy beam therefore makes it possible to modify structure of the material in a controlled way by virtue of the mixture of atoms in the material, which is induced by the irradiation.

Advantageously, for an industrial application, the ion beam has an extended cross-section so that it can irradiate a large surface, such as that of a semiconductor wafer, with a substantially constant angle of incidence over the entire cross-section.

The part not irradiated by the shadowing effect at the base of the masking pillar has a lateral extension d.

As a first approximation: $d=H\times\tan(i)$; where H is the height of the masking pillar and i is the angle of incidence of the ions (0° for a vertical beam and 90° for a horizontal beam).

Given a masking pillar of height H=50 nm, d=0 for i=0°, d=50 nm for i=45°, and d=280 nm for i=80°.

Thus, depending on the parameters of the ion beam, those of the masking pillar and those of the shape of the pad to be made, the angle of incidence is in the range 0° to 90°.

The penetration length R of the ions in a given material is an important parameter which depends on the energy of the ions and the intensity of the beam. The penetration length R is therefore defined depending on the thickness of the material to be irradiated to reach the first magnetic layer. The intensities and energies indicated above make it possible to contemplate a wide range of penetration lengths R and consequently thicknesses to be passed through.

Taking the penetration length into account, the part that is not irradiated at all by the shadowing effect has a lateral extension d: $d=\tan(i)\times[H-R\times\cos(i)]$, where H is the height of the masking pillar, i is the angle of the ions and R is the penetration length of the ions.

For example, for an energy of 20 keV, the penetration length R is typically 60 nm. With a masking pillar of height H=50 nm, d=0 for θ=0°, d=8 nm for i=45°, and d=200 nm for i=80°.

6. Alternative Embodiments of the Fabrication Method

The method described above can be modified in different ways.

After etching the masking pillar, it may be preferable to withdraw the resin from the primary masking pillar, using only the upper metal layers of the pad as a mask for the irradiation step(s).

It is not necessary to implement the etching step enabling the first magnetic layer to be exposed. This depends on the penetration length R, especially in view of the characteristics of the layers located above the first magnetic layer. If it is possible to modify magnetisation of the first magnetic layer by irradiation without having to eliminate all or part of the layers located above the same, it is preferable not to do so, if only to facilitate implementation of the method by speeding it up.

Besides, the order of the steps can be modified. For example, it is contemplatable to create a partial stack, limited to the lower layers, with the exposed extended layer being the first magnetic layer. The primary masking pad is then deposited directly onto the first magnetic layer and ion irradiation enables a region with the desired geometry to be delimited therein. Then, once the primary masking pad has been eliminated, the constituent upper regions of the pad are deposited: intermediate region, second magnetic region and electrode region.

Besides still, the method can also be modified when it is intended to fabricate pads consisting of a stack of regions other than that of the pad in FIG. 1. For example, the conductive contact region can in fact be a thicker part of the conductive track. In this case, the final step consists in continuing etching to bite into the extended conduction layer.

For example again, the second magnetic layer may not be necessary, although it is preferable. Omitting it simplifies the stacking process and reduces the interest of the etching step, as the first magnetic layer is more accessible to the ion beam.

The method can also be modified when it is intended to fabricate pads having another geometry. Instead of fabricating a "V" shaped pad, if it is desired to fabricate a triangular pad for example, the two irradiation steps can be replaced by a single step during which the ion source is displaced in a continuous movement with respect to the masking pillar so that the path of the projected shadow delimits, in the first magnetic layer, a triangular zone corresponding to the first magnetic region of the pad. The irradiation parameters are adjusted so that outside the shaded zone the magnetic material loses its magnetisation and inside the shaded zone, the magnetic material retains all or part of its magnetisation.

For example again, some geometries may require a masking pad to be made with another geometry and/or a step of modifying geometry of the mask between the first and second irradiations. For example, it is desired to make a pad including a central portion which is rectilinear along the direction j and, at each of its ends, a tip portion disposed at an angle with respect to the central portion. The tip portions are located on the same side of this reference plane defined by the directions j and n. Then, in a first masking step, the masking pad is made so as to include a parallelepiped bar carrying a first cylinder at one of its ends. The first irradiation thus makes it possible to delimit, in the magnetic material, a part of the central portion and a first tip portion of the pad to be made. Then, in a second masking step, the masking pad is modified by removing the first cylinder from the masking pad and a second cylinder is deposited at the other end of the parallelepiped bar. The second irradiation then makes it possible to delimit, in the magnetic material, a part of the central portion and the second tip portion of the pad to be made. Advantageously, the second irradiation is performed after turning the source about the perpendicular direction n while remaining on the same side of the masking pad. The angle for the second irradiation is, for example, equal to 180°−a1, where a1 is the angle of the first irradiation.

For example, a different number of irradiation steps can be used, especially a single irradiation step. For example, it is desired to define a simpler shape which is nonetheless non-symmetric with respect to the reference plane defined by the directions n and j. A single masking step is then used, using a cylindrical pad and irradiation in a single direction d1 having an angle a1 different from 0° and 90°. The part delimited in the magnetic material will then have the shape obtained after the first irradiation step 400 as described previously and represented in a top view on the left-hand side of FIG. 9. In this case, the irradiation parameters will be adjusted so that a single exposure cancels magnetisation of the zones exposed. The remainder of the steps will then be identical to the previous description with the exception of step 500, which will be omitted.

Although the method has been described for the case of magnetisation perpendicular to the plane of the constituent regions of the pad, it applies equally well to the case of magnetisation parallel to the plane of the constituent regions of the pad.

7. A Pad for which Asymmetry is Due to a Gradient of Magnetic Properties and a Limiting Case of the Present Fabrication Method The present method makes it possible to obtain an asymmetric pad even with a single ion irradiation step, especially along a plane of incidence orthogonal to the reference plane of the memory point.

Indeed, during ion irradiation, the cast shadow is not absolutely precisely delimited, so that following irradiation, the magnetic properties of the magnetic material have a gradient in the vicinity of the edges of the cast shadow.

This is especially true for the edge of the cast shadow corresponding to the upper ridge of the mask-forming pillar.

In the case where irradiation is performed along a plane of incidence orthogonal to the reference plane, this gradient is then oriented perpendicularly to the directions j and n. Yet, this magnetisation gradient breaks the mirror symmetry with respect to the reference plane defined by the directions j and n. Consequently, the presence of this magnetisation gradient is enough to create an asymmetry in the fabricated pad. It is as if the first magnetic region consisted in fact of a superimposition of elementary magnetic strata of the same magnetisation, elliptical, nested within each other and off-centre from each other perpendicularly to the direction j. It can therefore be said that the asymmetry of the pad is also a geometric asymmetry. By choosing the angle of incidence in the open range 10°, 180° [, a single ion irradiation makes it possible to obtain a gradient having a component perpendicularly to the reference plane and therefore to make an asymmetric SOT-MRAM memory point.

The invention claimed is:

1. A method for fabricating an asymmetric SOT-MRAM memory point, said memory point including a conductive track and a pad disposed on the conductive track and including at least one first magnetic region with free magnetisation, the method comprising:

making a stack of a plurality of extended layers, including at least one first extended magnetic layer;

depositing a mask onto an upper surface of the stack; and, delimiting the first magnetic region in the first extended magnetic layer by ion irradiation of the upper surface of the stack carrying the mask, the parameters of the ion irradiation being adapted to modify magnetic properties of the constituent material of the first magnetic layer, wherein the ion irradiation delimitation step includes, during an irradiation duration, relative displacement of an ion source with respect to the upper surface of the stack carrying the mask, the irradiation parameters being adapted to remove the magnetic properties of a zone exposed during the whole irradiation duration but being insufficient to remove the magnetic properties of a zone exposed only during a fraction of the irradiation duration.

2. The method according to claim 1, wherein the ion irradiation allows for modifying the magnetic properties of a zone of the first magnetic layer exposed during the ion irradiation, while retaining the magnetic properties of a zone of the first magnetic layer not exposed during the ion irradiation because of the presence of the mask.

3. The method according to claim 1, wherein ion irradiation implements light ions, preferably Het, of low energy, preferably between 10 and 100 keV, still more preferably equal to 30 keV, and with an intensity between $10^{14}$ and $10^{17}$ ions/cm$^2$, preferably equal to $10^{16}$ ions/cm$^2$.

4. The method according to claim 1, including, after the step of depositing a mask and before the ion irradiation delimitation step, an etching step consisting in etching the upper layers of the stack around the mask deposited so that the ion flow used during ion irradiation can reach the first magnetic layer.

5. The method according to claim 1, wherein making a stack of a plurality of extended layers consists in superimposing, on a semiconductor substrate, a conductive layer, a first magnetic layer, an intermediate layer, a second magnetic layer and an electrode layer.

6. The method according to claim 1, including, after the ion irradiation delimitation step, a step of finishing the memory point consisting in removing the mask, etching the stack to expose a conductive track on either side of the pad, and making electrodes at each of the ends of the conductive layer, as well as on the pad.

7. An asymmetric SOT-MRAM memory point obtained by implementing the fabrication method according to claim 1.

8. A method for fabricating an asymmetric SOT-MRAM memory point, said memory point including a conductive track and a pad disposed on the conductive track and including at least one first magnetic region with free magnetisation, the method comprising:

making a stack of a plurality of extended layers, including at least one first extended magnetic layer;

depositing a mask onto an upper surface of the stack; and, delimiting the first magnetic region in the first extended magnetic layer by ion irradiation of the upper surface of the stack carrying the mask, the parameters of the ion irradiation being adapted to modify magnetic properties of the constituent material of the first magnetic layer, wherein the ion irradiation delimitation step includes a first irradiation along a first direction of irradiation, followed by a second irradiation along a second direction of irradiation, the parameters of the first irradiation and the second irradiation being chosen to be sufficient to remove the magnetic properties of a zone exposed during both the first irradiation and the second irradiation, but insufficient to remove the magnetic properties of a zone exposed only during the first irradiation or only in the second irradiation.

9. The method according to claim 8, wherein the ion irradiation allows for modifying the magnetic properties of a zone of the first magnetic layer exposed during the ion irradiation, while retaining the magnetic properties of a zone of the first magnetic layer not exposed during the ion irradiation because of the presence of the mask.

10. The method according to claim 8, including, between the first ion irradiation and the second ion irradiation, a step of modifying the mask.

11. The method according to claim 8, wherein ion irradiation implements light ions, preferably Het, of low energy, preferably between 10 and 100 keV, still more preferably equal to 30 keV, and with an intensity between $10^{14}$ and $10^{17}$ ions/cm$^2$, preferably equal to $10^{16}$ ions/cm$^2$.

12. The method according to claim 8, including, after the step of depositing a mask and before the ion irradiation delimitation step, an etching step consisting in etching the upper layers of the stack around the mask deposited so that the ion flow used during ion irradiation can reach the first magnetic layer.

13. The method according to claim 8, wherein making a stack of a plurality of extended layers consists in superimposing, on a semiconductor substrate, a conductive layer, a first magnetic layer, an intermediate layer, a second magnetic layer and an electrode layer.

14. The method according to claim 8, including, after the ion irradiation delimitation step, a step of finishing the memory point consisting in removing the mask, etching the stack to expose a conductive track on either side of the pad, and making electrodes at each of the ends of the conductive layer, as well as on the pad.

15. An asymmetric SOT-MRAM memory point obtained by implementing the fabrication method according to claim 8.

* * * * *